(12) United States Patent
Lee et al.

(10) Patent No.: US 9,018,766 B2
(45) Date of Patent: Apr. 28, 2015

(54) SEMICONDUCTOR DEVICE AND METHOD FOR MANUFACTURING THE SAME

(71) Applicant: SK Hynix Inc., Icheon (KR)

(72) Inventors: Woo Jun Lee, Icheon (KR); Seong Wan Ryu, Yongin (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/340,496

(22) Filed: Jul. 24, 2014

(65) Prior Publication Data

US 2014/0335690 A1     Nov. 13, 2014

Related U.S. Application Data

(62) Division of application No. 13/718,980, filed on Dec. 18, 2012, now abandoned.

(30) Foreign Application Priority Data

Aug. 31, 2012 (KR) ........................ 10-2012-0096725

(51) Int. Cl.
*H01L 21/768* (2006.01)
*H01L 23/532* (2006.01)
*H01L 23/485* (2006.01)

(52) U.S. Cl.
CPC ...... *H01L 21/7688* (2013.01); *H01L 23/53257* (2013.01); *H01L 21/76889* (2013.01); *H01L 21/76877* (2013.01); *H01L 21/76897* (2013.01); *H01L 23/485* (2013.01); *H01L 23/53271* (2013.01); *H01L 21/76885* (2013.01); *H01L 21/7682* (2013.01); *H01L 21/76843* (2013.01); *H01L 21/76849* (2013.01); *H01L 21/7685* (2013.01); *H01L 21/76852* (2013.01); *H01L 21/76855* (2013.01); *H01L 2924/0002* (2013.01)

(58) Field of Classification Search
CPC ............ H01L 21/768; H01L 21/76838; H01L 21/76877; H01L 21/7688; H01L 21/76886; H01L 21/76889; H01L 21/76897
See application file for complete search history.

(56) References Cited

U.S. PATENT DOCUMENTS

| | | | |
|---|---|---|---|
| 8,110,499 B2 | 2/2012 | Kang et al. | |
| 2007/0123019 A1* | 5/2007 | Lim et al. | 438/611 |
| 2010/0285662 A1* | 11/2010 | Kim et al. | 438/675 |
| 2012/0313151 A1* | 12/2012 | Lee | 257/288 |

FOREIGN PATENT DOCUMENTS

| | | |
|---|---|---|
| KR | 10-2006-0073749 A | 6/2006 |
| KR | 10-1120181 B1 | 2/2012 |

* cited by examiner

*Primary Examiner* — Eduardo A Rodela

(57) ABSTRACT

A semiconductor device includes: a contact hole formed over a structure including a conductive pattern; a contact plug formed in the contact hole; a first metal silicide film surrounding the contact plug; and a second metal silicide film formed over the contact plug.

19 Claims, 12 Drawing Sheets

(i)

(ii)

(iii)

(i)

(ii)

(iii)

SEMICONDUCTOR DEVICE AND METHOD FOR MANUFACTURING THE SAME

CROSS-REFERENCE TO RELATED APPLICATION

The present application is a divisional of U.S. patent application Ser. No. 13/718,980, filed on Dec. 18, 2012, which claims to priority of Korean Patent Application No. 10-2012-0096725 filed 31 Aug. 2012, which are incorporated by reference in their entirety.

BACKGROUND OF THE INVENTION

Embodiments of the present invention relate to a contact of a semiconductor device.

Typically, in order to reduce contact resistance of a contact in a semiconductor device, a metal silicide layer is formed between a contact region of a semiconductor substrate and a contact or plug. That is, silicification in which silicon (Si) contained in the contact region of the semiconductor substrate is reacted with a metal material contained in a metal layer, which forms a metal silicide film between the contact region and the contact, such that contact resistance or interfacial resistance between the contact and the contact region can be reduced.

Generally, it is known to those skilled in the art that a cleaning process is performed to remove impurities from the surface of the contact region, a metal layer is formed over the cleaned contact region, and a silicification process is then performed on the resultant metal layer in such a manner that a metal silicide film can be effectively formed over the contact region.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to an apparatus and method for solving the problems of the related art in which the size of a contact hole is reduced due to increasing integration of semiconductor devices, and the size of a metal silicide film is correspondingly reduced, so that contact resistance is increased.

In accordance with an aspect of the present invention, a semiconductor device includes: an interlayer insulation film formed over a structure including a conductive pattern; a contact hole disposed in the interlayer insulation film and having a depth sufficient to reach the structure including the conductive pattern, the contact hole having a center portion and an edge portion; contact plug provided in the center portion of the contact hole; and a first metal silicide film including an inner part of the contact hole; a second metal silicide film disposed over the contact plug.

The contact plug may include a silicon material.
The contact plug may include a polysilicon material.
The second metal silicide film may be diffused into the contact plug.

In accordance with another aspect of the present invention, a method for forming a semiconductor device includes: forming an interlayer insulation film over a structure including a conductive pattern; etching the interlayer insulation film to form a contact hole exposing the structure including the conductive pattern; forming a sacrificial insulation film spacer in an edge portion of the contact hole; forming a contact plug in a center portion of the contact hole; removing the sacrificial insulation film spacer to form an air spacer; forming a first metal silicide film in the air spacer; and forming a second metal silicide film over the contact plug.

The forming of the sacrificial insulation film spacer may include forming a sacrificial insulation film over the interlayer insulation film; and etching back the sacrificial insulation film.

The sacrificial insulation film may include an oxide film or a nitride film.

The contact plug may include a silicon material.
The contact plug may include a polysilicon material.

The forming of the air spacer may include performing a dip-out process removing the sacrificial insulation film spacer.

The forming of the first metal silicide film and the second metal silicide film may include: forming a metal layer over the contact plug and the interlayer insulation film to fill the air spacer; and performing a silicification process on the metal layer.

The metal layer may include titanium (Ti), nickel (Ni), tantalum (Ta), tungsten (W) or cobalt (Co).

The second metal silicide film may be formed to be diffused into the contact plug.

In accordance with another aspect of the present invention, a method for forming a semiconductor device includes: forming a contact plug over a structure including a conductive pattern; forming a sacrificial insulation film spacer surrounding the contact plug; forming an interlayer insulation film over the structure including the conductive pattern; forming an air spacer by removing the sacrificial insulation film spacer; and forming a first metal silicide film in the air spacer, and forming a second metal silicide film over the contact plug.

The forming of the contact plug may include: forming a conductive layer over the structure including the conductive pattern; forming a photoresist pattern over the conductive layer; and etching the conductive layer using the photoresist pattern as a mask.

The conductive layer may include a silicon material.
The conductive layer may include a polysilicon material.

The forming of the sacrificial insulation film spacer may include: forming a sacrificial insulation film over the contact plug; and etching back the sacrificial insulation film.

The sacrificial insulation film may include an oxide film or a nitride film.

The forming of the air spacer may include performing a dip-out process removing the sacrificial insulation film spacer.

The forming of the first metal silicide film and the second metal silicide film may include: forming a metal layer over the contact plug and the interlayer insulation film to fill the air spacer; and performing a silicification process on the metal layer.

The metal layer may include titanium (Ti), nickel (Ni), tantalum (Ta), tungsten (W) or cobalt (Co).

The second metal silicide film may be formed to be diffused into the contact plug.

In accordance with another aspect of the present invention, a semiconductor device includes: a contact plug epitaxially grown from a semiconductor substrate; a first metal silicide film formed surrounding the contact plug; and a second metal silicide film formed over the contact plug.

The second metal silicide film may be formed to be diffused into the contact plug.

In accordance with another aspect of the present invention, a method for forming a semiconductor device includes: epitaxially growing a contact plug over a semiconductor substrate using the semiconductor substrate as a seed layer; forming a sacrificial insulation film spacer surrounding the contact plug; forming an interlayer insulation film over the semiconductor substrate; forming an air spacer by removing the sacrificial insulation film spacer; forming a first metal silicide film in the air spacer; and forming a second metal silicide film over the contact plug.

The forming of the sacrificial insulation film spacer may include: forming a sacrificial insulation film over the contact plug; and etching back the sacrificial insulation film.

The sacrificial insulation film may include an oxide film or a nitride film.

The forming of the air spacer may include performing a dip-out process on the sacrificial insulation film spacer.

The forming of the first metal silicide film and the second metal silicide film may include: forming a metal layer over the contact plug and the interlayer insulation film so as to fill the air spacer; and performing a silicification process on the metal layer.

The metal layer may include titanium (Ti), nickel (Ni), tantalum (Ta), tungsten (W) or cobalt (Co).

The second metal silicide film may be formed to be diffused into the contact plug.

It is to be understood that both the foregoing general description and the following detailed description of the present invention are exemplary and explanatory and are intended to provide further explanation of the invention as claimed.

BRIEF DESCRIPTION OF THE DRAWINGS

In FIG. 1, (i) is an isometric view illustrating a contact plug, (ii) is a plan view illustrating the contact plug, and (iii) is a cross-sectional view illustrating the contact plug taken along the line X-X' of (i).

DESCRIPTION OF EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 1:
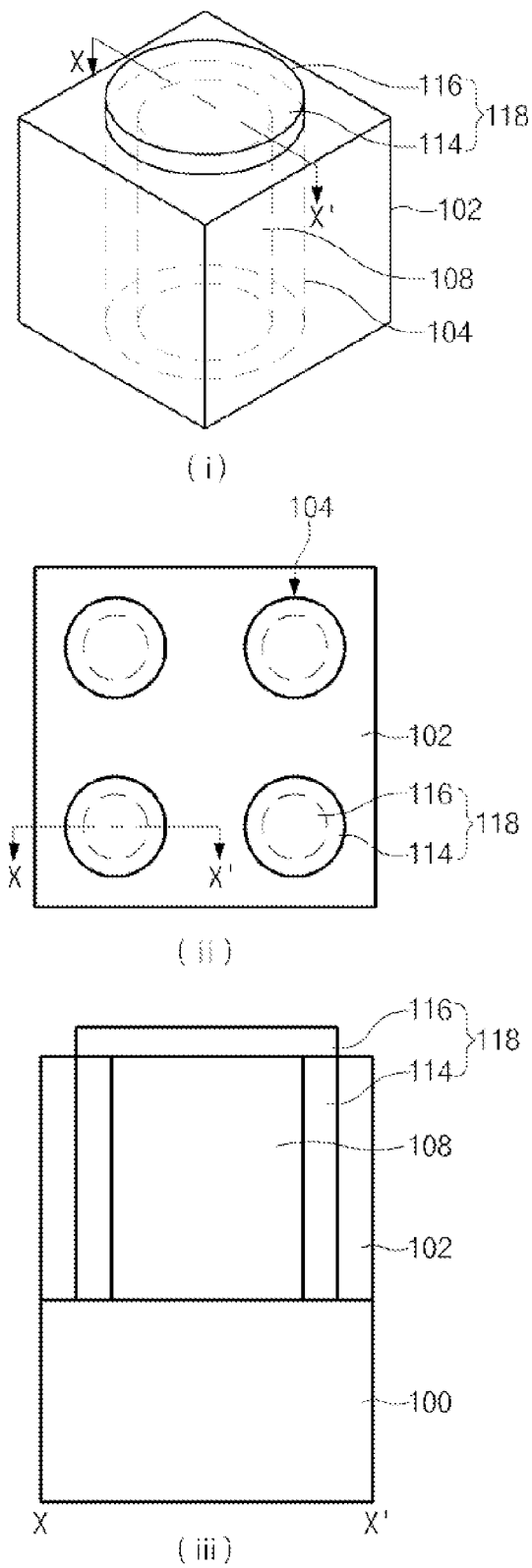
FIG. 1 illustrates a semiconductor device according to an embodiment of the present invention.

FIG. 1 illustrates a semiconductor device according to an embodiment of the present invention. In FIG. 1, (i) is an isometric view illustrating a contact plug, (ii) is a plan view illustrating the contact plug, and (iii) is a cross-sectional view illustrating the contact plug taken along the line X-X' of (i).

Referring to FIGS. 1(i) and 1(ii), an embodiment of a semiconductor device according to the present invention includes a contact hole 104, a first metal silicide film 114, a contact plug 108, and a second metal silicide film 116. In more detail, the contact hole 104 is disposed in an interlayer insulation film 102 formed over a structure 100 which includes a conductive pattern. A first metal silicide film 114 is formed to surround the inside of the contact hole 104. The contact plug 108 is formed in the first metal silicide film 114 such that it is buried in the contact hole 104. The second metal silicide film 116 is disposed over the contact plug 108, and in particular it is disposed over an upper surface of the contact plug 108. Although the contact hole 104, contact plug 108, and first metal silicide film 114 are illustrated as having a cylindrical shape with a circular profile, the scope of the present invention is not limited to a particular shape or profile; for example, other embodiments may have a rectangular profile.

In an embodiment, it is preferable that the contact plug 108 includes a silicon (Si) material. More specifically, it is preferable that the contact plug 108 includes a polysilicon material. The second metal silicide film 116 may be formed over the contact plug 108, and may be partially diffused into the contact plug 108. In addition, a width of an upper part of the contact hole 104 may be larger than a width of a lower part of the contact hole 104. However, the scope of the present invention is not limited thereto, and the upper or lower part of the contact hole 104 may have different widths according to relevant design considerations. For convenience of description and better understanding of the present invention, the figures and following description assume that the width of the upper part of the contact hole 104 is that the same as the width of the lower part of the contact hole 104.

Since the metal silicide film according to an embodiment of the present invention includes a first metal silicide film surrounding the inside of a contact hole and a second metal silicide film formed over the contact plug, the area of the metal silicide film is increased in size. In particular, the surface area of the interface between silicide and the contact plug is increased. Therefore, in an embodiment in which the size of the contact hole is reduced, the area of the metal silicide film is not reduced in size so that contact resistance is not increased.

A method for forming the above-mentioned semiconductor device according to an embodiment of the present invention will hereinafter be described with reference to FIGS. 2A to 2D.

FIGS. 2A to 2D illustrate a method for forming a semiconductor device according to an embodiment of the present invention. In each of FIGS. 2A to 2D, (i) is an isometric view illustrating a contact plug, (ii) is a plan view illustrating the contact plug, and (iii) is a cross-sectional view illustrating the contact plug taken along the line X-X' of (i). FIGS. 2A to 2D illustrate an embodiment in which a contact plug is formed over an interlayer insulation film.

Figure 2A:
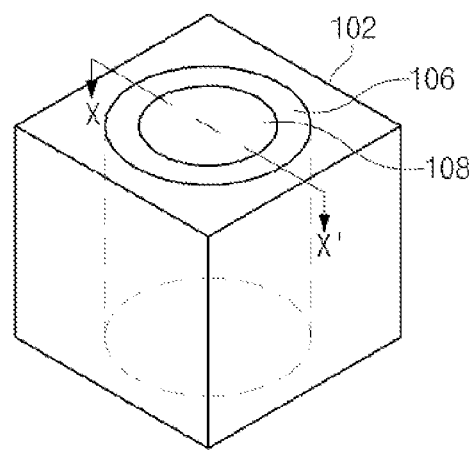
FIGS. 2A to 2D illustrate a method for forming a semiconductor device according to an embodiment of the present invention. In each of FIGS. 2A to 2D, (i) is an isometric view illustrating a contact plug, (ii) is a plan view illustrating the contact plug, and (iii) is a cross-sectional view illustrating the contact plug taken along the line X-X' of (i).
Figure 2A:
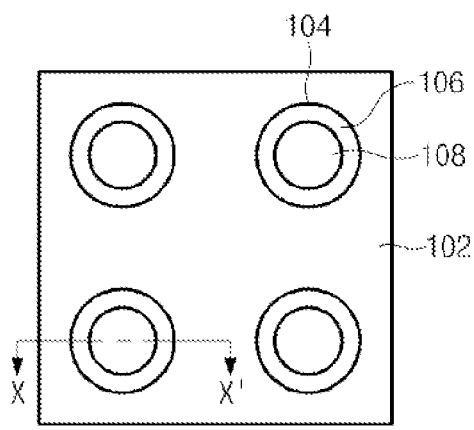
Figure 2A:
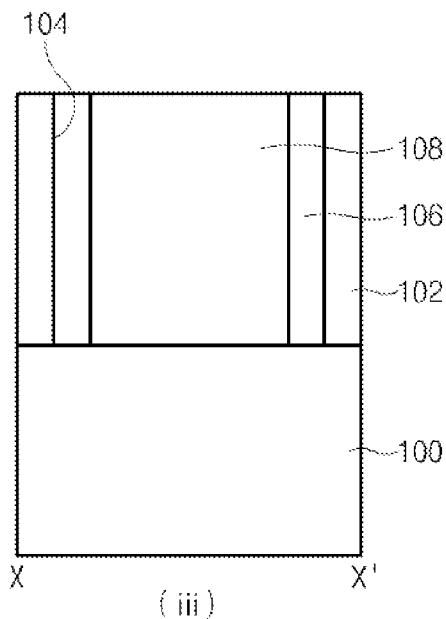

Referring to FIG. 2A(i), after forming an interlayer insulation film 102 over the structure 100 including a conductive pattern, a contact hole 102 is formed to expose the structure 100 including the conductive pattern. Subsequently, a sacrificial insulation film is deposited over the interlayer insulation film 102 including a contact hole 104. In an embodiment, the sacrificial insulation film may include an oxide film or a nitride film. In an embodiment, an upper part of the contact hole 104 is larger in width than a lower part of the contact hole 104. However, the scope of the present invention is not limited thereto, and the width of the contact hole 104 may be another width according to design considerations of embodiments of the present invention. For convenience of description and better understanding of the present invention, the following description assumes that the upper part of the contact hole 104 has the same width as the lower part thereof.

Thereafter, the sacrificial insulation film is etched back so that a sacrificial insulation film spacer 106 is formed to surround a center portion of the contact hole 104. In other words, sacrificial film spacer 106 is formed over the inner sidewall of contact hole 104. Then a contact plug 108 is formed to fill the center portion of contact hole 104. Preferably, the contact plug 108 may include a silicon (Si) material, more specifically, a polysilicon material.

Therefore, as shown in FIGS. 2A(ii) and 2A(iii), the sacrificial insulation film 106 and the contact plug 108 are buried in the contact hole 104 contained in the interlayer insulation film 102.

Figure 2B:
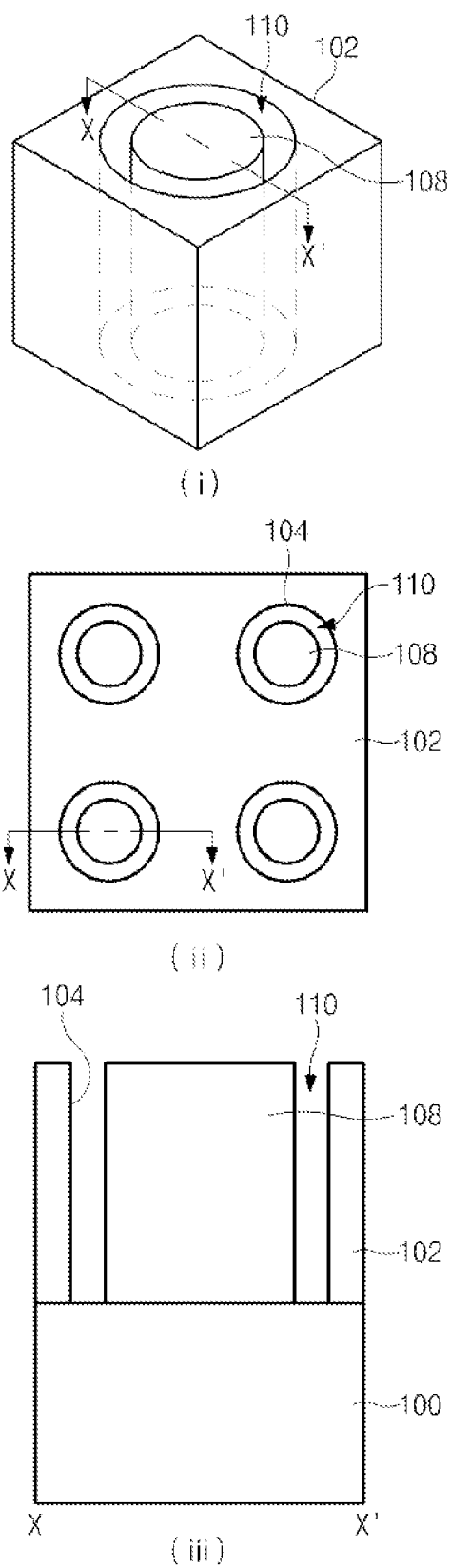

Referring to FIG. 2B(i), the sacrificial insulation film spacer 106 is etched to expose the structure 100 including the conductive pattern, such that an air-spacer 110 is formed between the contact hole 104 and the contact plug 108. Preferably, the sacrificial insulation film spacer 106 may be etched using a dip-out process. During the dip-out process, impurities remaining on the surface of the structure 100 including the conductive pattern and impurities on a sidewall of the contact plug 108 can be simultaneously removed.

Accordingly, as shown in FIGS. 2B(ii) and 2B(iii), the air spacer 110 is formed between the sidewall of the interlayer insulation film 102 exposed by the contact hole 104 and the contact plug 108 contained in the contact hole 104, so that the structure 100 including the conductive pattern is exposed.

Figure 2C:
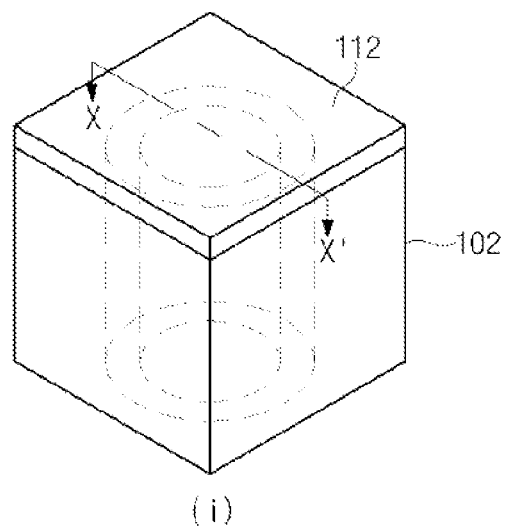
Figure 2C:
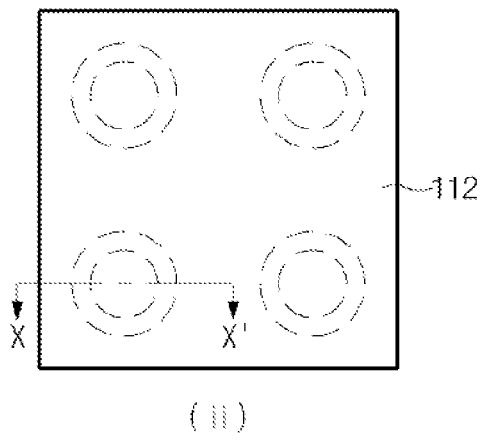
Figure 2C:
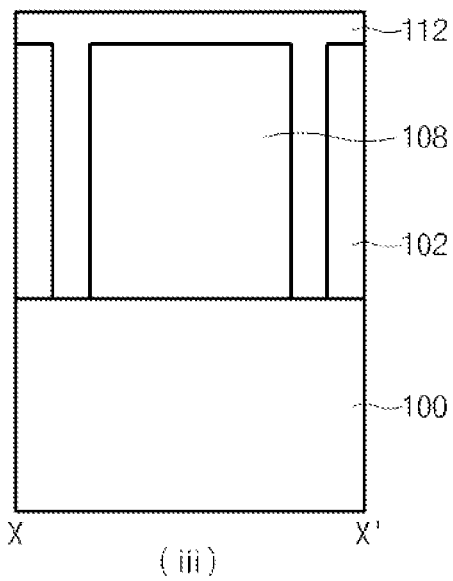

Referring to FIG. 2C(i), a metal layer 112 is formed not only in the air spacer 110 but also over the contact plug 108 and the interlayer insulation film 102. Preferably, the metal layer 112 may include titanium (Ti), nickel (Ni), tantalum (Ta), tungsten (W) or cobalt (Co).

Therefore, as shown in FIGS. 2C(ii) and 2C(iii), the metal layer 112 is buried between the interlayer insulation film 102 and the contact plug 108, and is formed over the interlayer insulation film 102 and the contact plug 108.

Figure 2D:
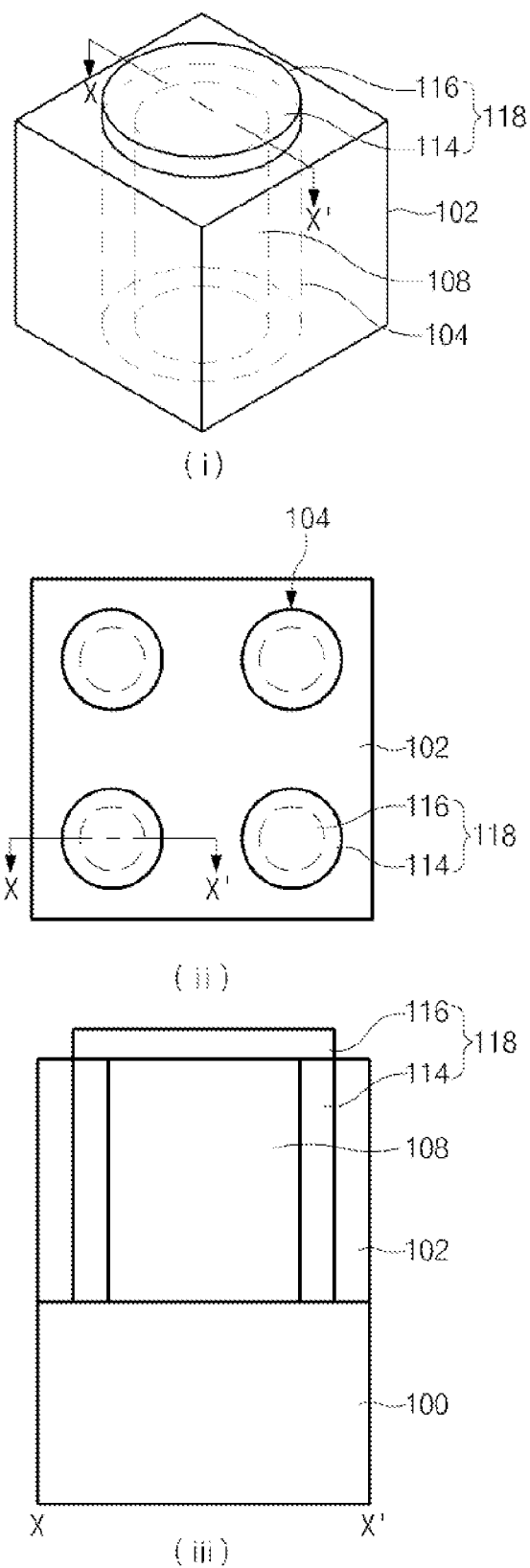

Referring to FIG. 2D(i), a silicification process is performed on the metal layer 112 to form a metal silicide film 118. Here, the silicification process may include a heat treatment or annealing process, and fabrication conditions such as temperature and time of the silicification process may be changed according to properties of the material of metal layer 112. In addition, in order to facilitate transformation from the metal layer 112 into the metal silicide film 118, the metal layer 112 may be formed to have a thickness of less than 10 nm. Then, the reminded metal layer 112 is etched.

The metal silicide film 118 includes a first metal silicide film 114 surrounding a sidewall of the contact plug 108 and a second metal silicide film 116 formed over the contact plug 108. The second metal silicide film 116 may be formed over the contact plug 108 according to silicification conditions or properties of the metal layer 112, and may be partially diffused into the contact plug 108.

Therefore, as can be seen from FIGS. 2D(ii) and 2D(iii), the metal silicide film 118 includes: a first metal silicide film 114 interposed between a sidewall of the contact hole 104 and a sidewall of the contact plug 108; and a second metal silicide film 116 formed over the contact plug 108.

As a result, the area of the metal silicide film is increased relative to a conventional configuration. Thus, when a contact hole is reduced in size to create a higher density device, the area of the metal silicide film is not reduced, such that contact resistance is not increased.

An embodiment in which a contact plug is formed over an interlayer insulation film will hereinafter be described with reference to FIGS. 3A to 3E.

FIGS. 3A to 3E are cross-sectional views illustrating a method for forming a semiconductor device according to an embodiment of the present invention.

Figure 3A:
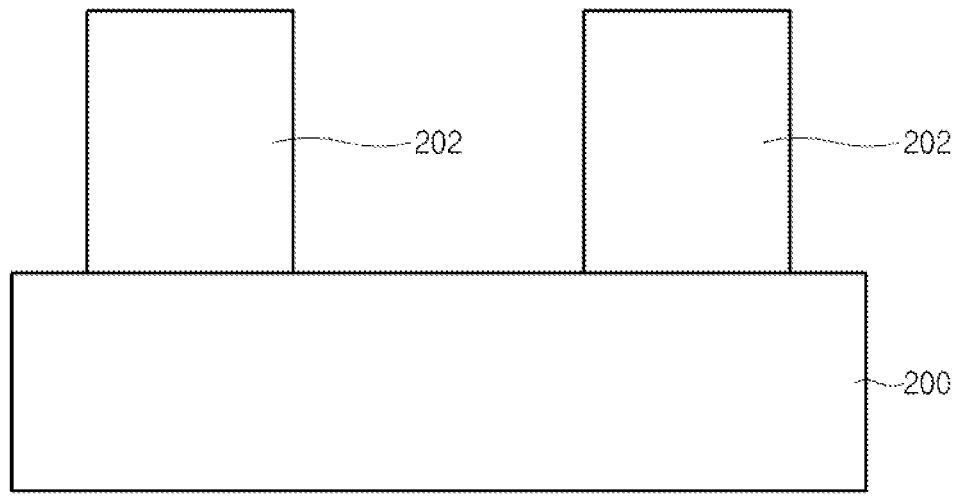
FIGS. 3A to 3E are cross-sectional views illustrating a method for forming a semiconductor device according to an embodiment of the present invention.

Referring to FIG. 3A, a contact plug 202 is formed over a structure 200 including a conductive pattern. In an embodiment, the contact plug 202 may include a silicon (Si) material. More preferably, the contact plug 202 may include polysilicon. In accordance with a method for forming the contact plug 202, after a polysilicon film is formed over the structure 200 including a conductive pattern, the polysilicon film is etched using a predetermined photoresist pattern as an etch mask such that the contact plug 202 is formed.

Figure 3B:
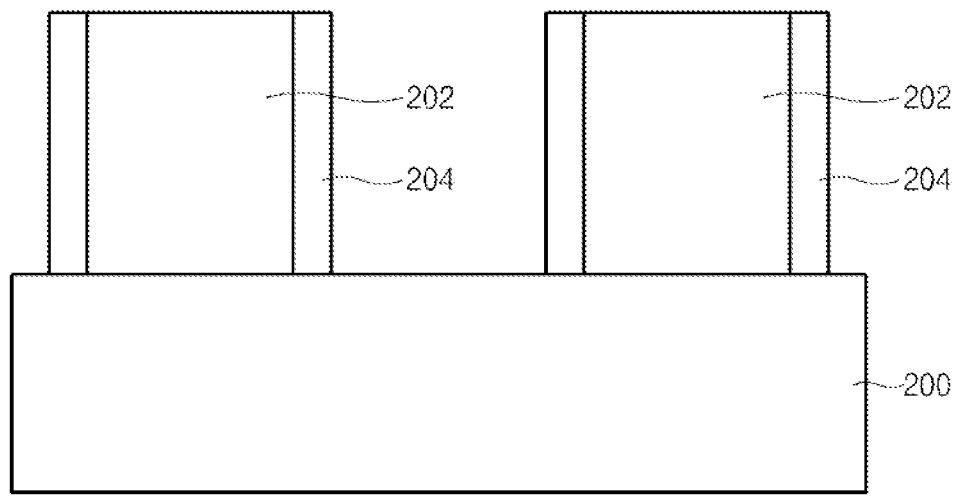

Referring to FIG. 3B, a sacrificial insulation film spacer 204 is formed over a sidewall of the contact plug 202. In accordance with a method for forming the sacrificial insulation film spacer 204, a sacrificial insulation film is formed over the upper surface of the semiconductor device including the contact plug 202, and an etchback process is performed on the resultant structure so that the sacrificial insulation film spacer 204 is formed. In an embodiment, the sacrificial insulation film spacer 204 surrounds the contact plug 202. Preferably, the sacrificial insulation film may include an oxide film or a nitride film.

Figure 3C:
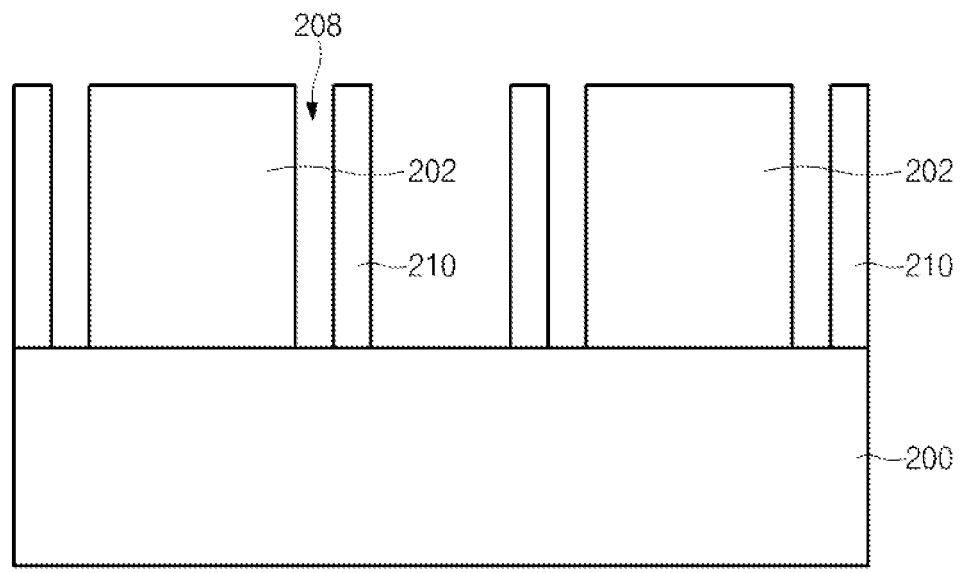

Referring to FIG. 3C, an interlayer insulation film 210 is formed over the structure 200 including a conductive pattern over which the sacrificial insulation film spacer 204 is formed. Thereafter, the sacrificial insulation film spacer 204 is removed to expose the structure 200 including the conductive pattern, such that the air spacer 208 is formed. In an embodiment, the sacrificial insulation film spacer 204 may be removed using the dip-out process.

Figure 3D:
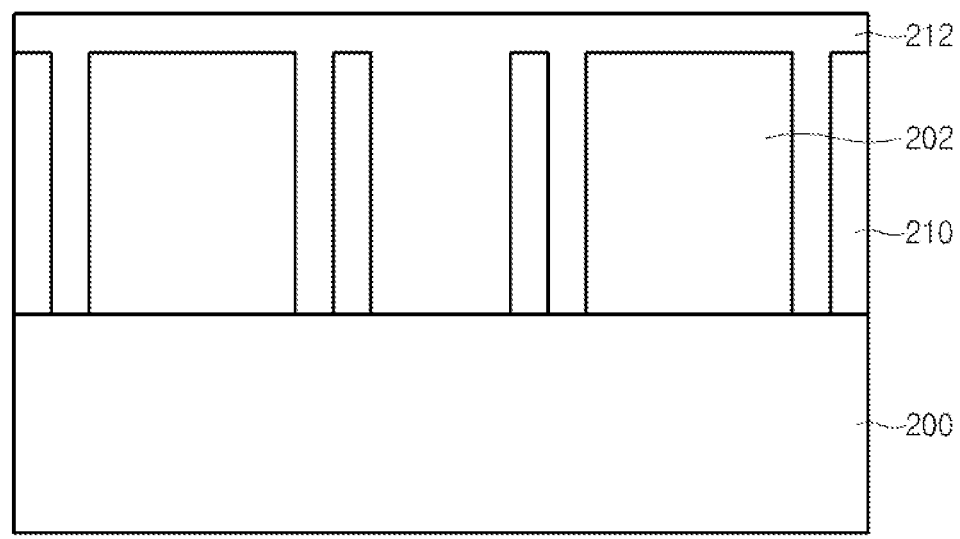

Referring to FIG. 3D, the metal layer 312 is formed over the contact plug 202 and the interlayer insulation film 210 to fill the air spacer 208. Preferably, the metal layer 212 may include titanium (Ti), nickel (Ni), tantalum (Ta), tungsten (W) or cobalt (Co).

Figure 3E:
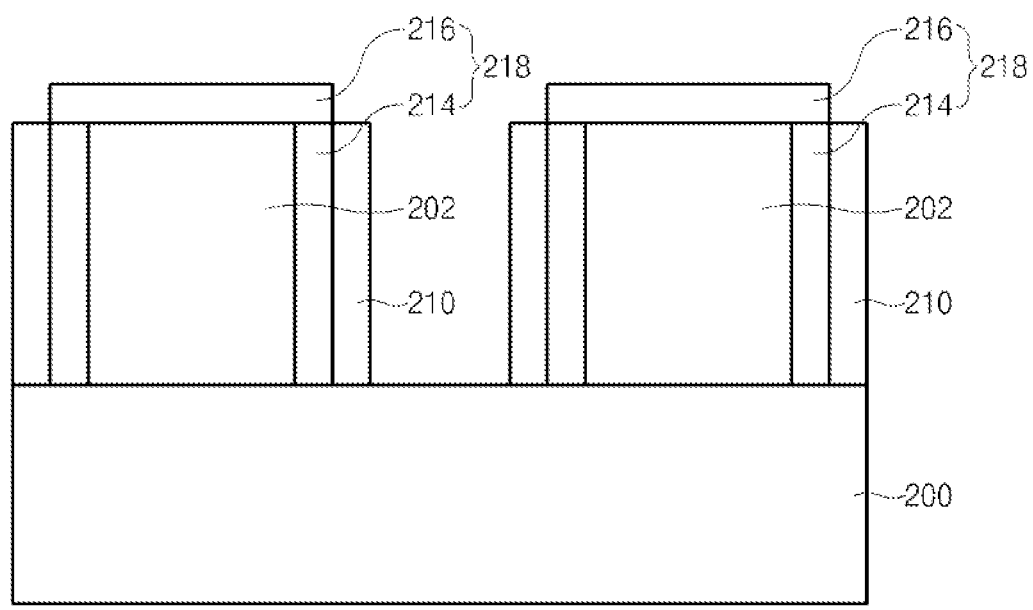

Referring to FIG. 3E, a silicification process is performed on the metal layer 212 to form a metal silicide film 218. Here, the silicification process may include a heat treatment or annealing process, and fabrication conditions such as temperature and time of the silicification process may be changed according to properties of the metal layer 212. In addition, in order to facilitate transformation from the metal layer 212 to the metal silicide film 218, the metal layer 212 may be formed to have a thickness of less than 10 nm.

The metal silicide film 218 includes a first metal silicide film 214 surrounding a sidewall of the contact plug 202 and a second metal silicide film 216 formed over the contact plug 202. The second metal silicide film 216 may be formed over the contact plug 202 according to silicification conditions or properties of the metal layer 212, and may be partially diffused into the contact plug 202.

As described above, in an embodiment, a contact plug and silicide films can be formed without first forming a contact hole in an insulation layer.

A semiconductor device in which a contact plug is formed over a semiconductor substrate according to another embodiment of the present invention will hereinafter be described with reference to FIG. 4.

Figure 4:
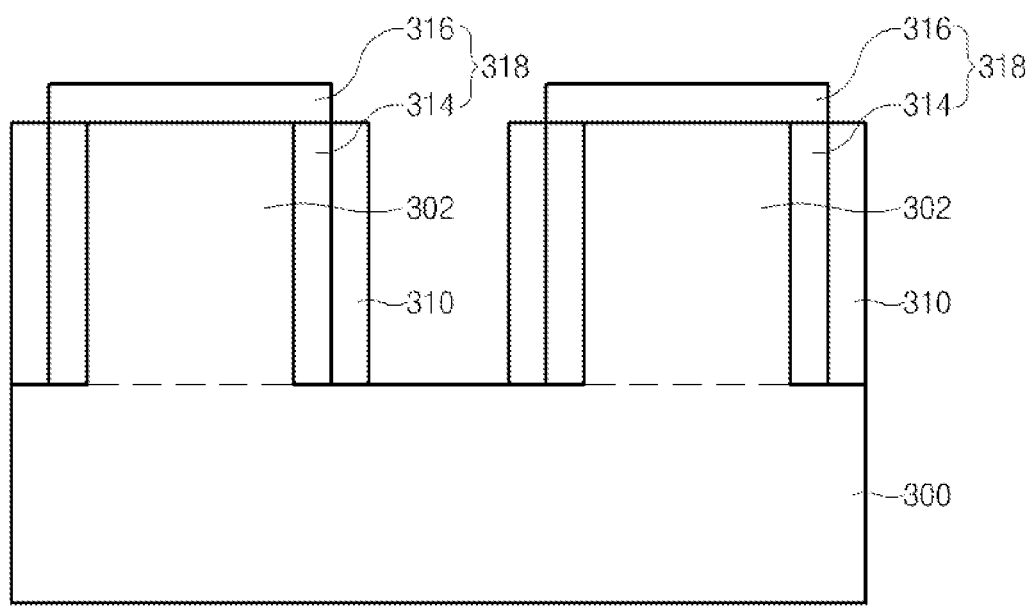
FIG. 4 illustrates a semiconductor device according to another embodiment of the present invention.

FIG. 4 illustrates a semiconductor device according to an embodiment of the present invention.

Referring to FIG. 4, a semiconductor device according to an embodiment of the present invention includes an epitaxial growth layer 302 grown from a semiconductor substrate 300; a first metal silicide film 314 surrounding the epitaxial growth layer 302; and a second metal silicide film 316 formed over the epitaxial growth layer 302. In an embodiment, the second metal silicide film 316 is disposed over the epitaxial growth layer 302, and may be partially diffused into the epitaxial growth layer 302.

Since the metal silicide film according to an embodiment of the present invention includes the first metal silicide film surrounding the epitaxial growth layer grown from the semiconductor substrate and the second metal silicide film formed over the epitaxial growth layer, the entire metal silicide film is increased in size, which may reduce contact resistance of a contact plug at an interface between a metal and a silicon.

A method for forming a semiconductor device in which a contact plug is formed over a semiconductor substrate according to an embodiment of the present invention will hereinafter be described with reference to FIGS. 5A to 5E. FIGS. 5A to 5E are cross-sectional views illustrating a method for forming a semiconductor device according to an embodiment of the present invention using an epitaxial growth process.

Figure 5A:
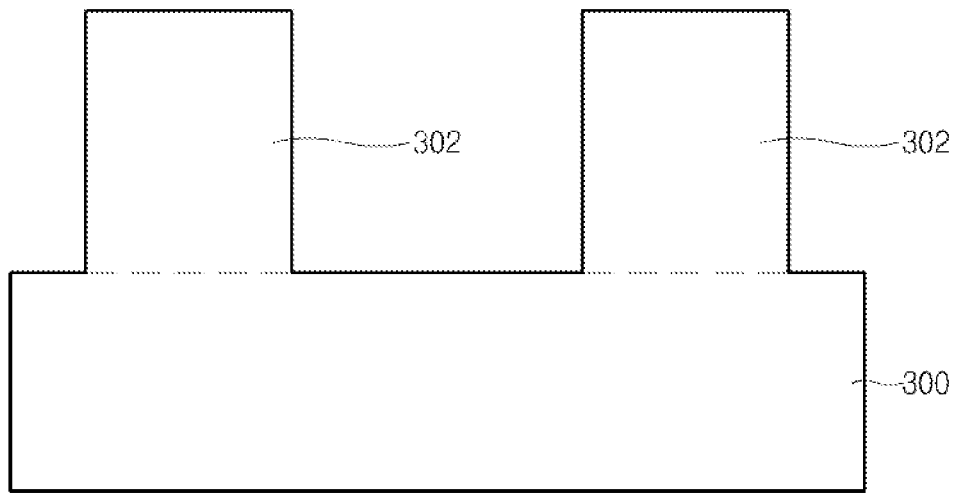
FIGS. 5A to 5E are cross-sectional views illustrating a method for forming a semiconductor device according to an embodiment of the present invention.

Referring to FIG. 5A, a contact plug 302 is epitaxially grown from a semiconductor substrate 300. In accordance with a method for forming the contact plug 302, after an interlayer insulation film (not shown) with holes exposing contact regions of the semiconductor substrate is formed over the semiconductor substrate 300, an epitaxial growth process is performed using the semiconductor substrate 300 as a seed layer to form contact plug 302.

Figure 5B:
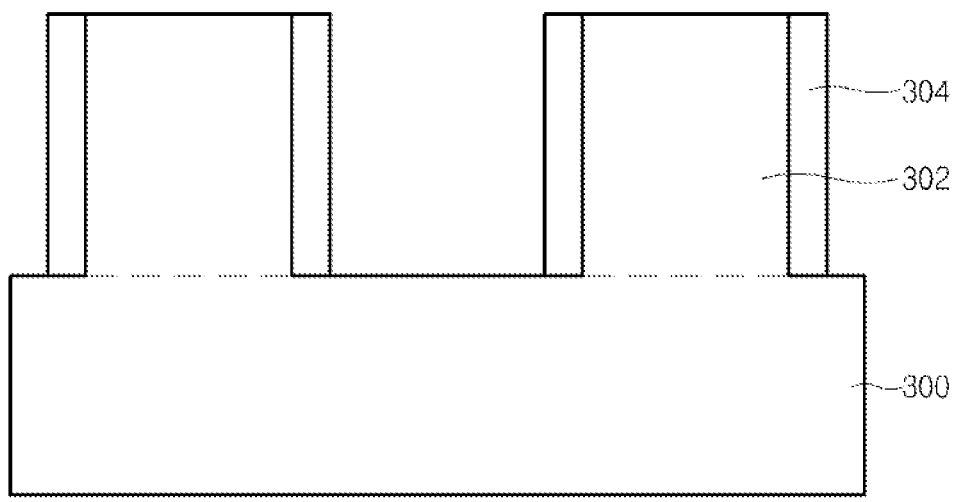

Referring to FIG. 5B, a sacrificial insulation film spacer 304 is formed over a sidewall of the epitaxial growth layer spacer 302 to en. In order to form the sacrificial insulation film spacer 304, a sacrificial insulation film is formed over the semiconductor substrate 300 including the contact plug 302, and is then etched back such that the sacrificial insulation film spacer 304 can be formed. In an embodiment, the sacrificial insulation film may include an oxide film or a nitride film.

Figure 5C:
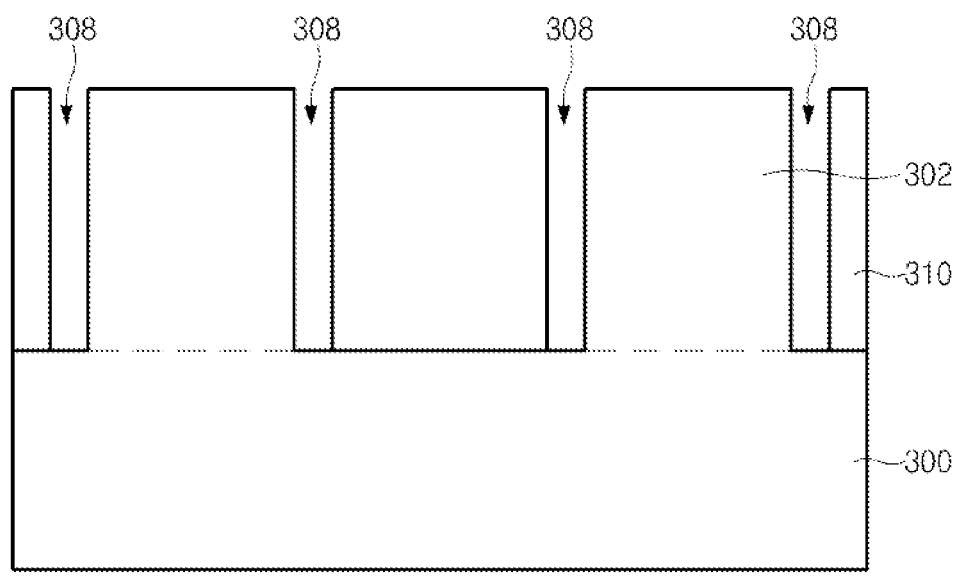

Referring to FIG. 5C, an interlayer insulation film 310 is formed over the semiconductor substrate 300, and planarized to expose upper surfaces of the contact plug 302 and the sacrificial insulation film spacer 304. Thereafter, the sacrificial insulation film spacer 304 is removed to expose the semiconductor substrate 300 so that an air spacer 308 is formed. Preferably, the sacrificial insulation film spacer 304 may be removed using the dip-out process.

Figure 5D:
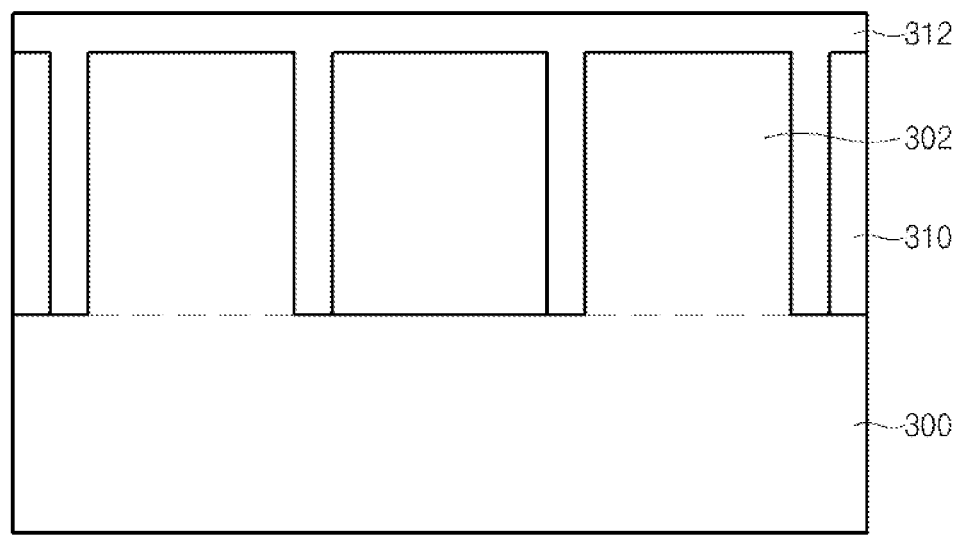

Referring to FIG. 5D, a metal layer 312 is formed over the contact plug 302 and the interlayer insulation film 310 to fill the air spacer 308. In an embodiment, the metal layer 312 may include titanium (Ti), nickel (Ni), tantalum (Ta), tungsten (W) or cobalt (Co).

Figure 5E:
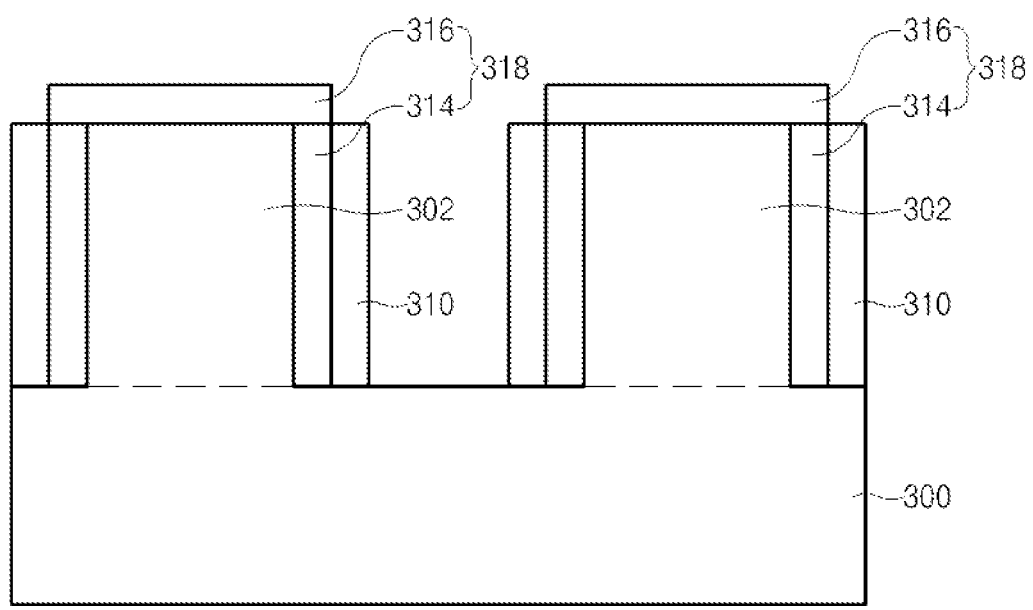

Referring to FIG. 5E, a silicification process is performed on the metal layer 312 to form a metal silicide film 318. The silicification process may include a heat treatment or annealing process, and fabrication conditions such as temperature and time of the silicification process may be determined according to properties of the metal layer 312. In addition, in order to facilitate transformation from the metal layer 312 to the metal silicide film 318, the metal layer 312 may be formed to have a thickness of less than 10 nm.

The metal silicide film 318 includes a first metal silicide film 314 surrounding the contact plug 302 and a second metal silicide film 316 formed over the contact plug 302. The second metal silicide film 316 may be formed over the epitaxial growth layer 302 by performing silicification on corresponding regions of the metal layer 312, and may be partially diffused into the contact plug 302. Then, the reminded metal layer 312 is etched.

Since the metal silicide film according to an embodiment of the present invention includes the first metal silicide film surrounding the epitaxial growth layer grown from the semiconductor substrate and the second metal silicide film formed over the epitaxial growth layer, embodiments of the present invention may have favorable contact resistance characteristics.

As is apparent from the above description, although a contact plug is reduced in size due to higher integration of a semiconductor device, the region of the metal silicide film can be increased relative to a device where silicide is only present at a junction, such that contact resistance can be reduced and semiconductor device characteristics can be improved.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method for forming a semiconductor device comprising:
    forming an interlayer insulation film over a structure including a conductive pattern;
    etching the interlayer insulation film to form a contact hole exposing the structure including the conductive pattern;
    forming a sacrificial insulation film spacer in an edge portion of the contact hole;
    forming a contact plug in a center portion of the contact hole;
    removing the sacrificial insulation film spacer to form an air spacer;
    forming a first metal silicide film in the air spacer; and
    forming a second metal silicide film over the contact plug.

2. The method according to claim 1, wherein forming the sacrificial insulation film spacer includes:
    forming a sacrificial insulation film over the interlayer insulation film; and
    etching back the sacrificial insulation film.

3. The method according to claim 2, wherein the sacrificial insulation film includes an oxide film or a nitride film.

4. The method according to claim 1, wherein the contact plug includes a silicon material.

5. The method according to claim 1, wherein the contact plug includes a polysilicon material.

6. The method according to claim 1, wherein forming the air spacer includes performing a dip-out process removing the sacrificial insulation film spacer.

7. The method according to claim 1, wherein forming the first metal silicide film and the second metal silicide film includes:
    forming a metal layer over the contact plug and the interlayer insulation film to fill the air spacer; and
    performing a silicification process on the metal layer.

8. The method according to claim 7, wherein the metal layer includes titanium (Ti), nickel (Ni), tantalum (Ta), tungsten (W) or cobalt (Co).

9. The method according to claim 1, wherein the second metal silicide film is diffused into the contact plug.

10. A method for forming a semiconductor device comprising:
    forming a contact plug over a structure including a conductive pattern;
    forming a sacrificial insulation film spacer surrounding the contact plug;
    forming an interlayer insulation film over the structure including the conductive pattern;
    forming an air spacer by removing the sacrificial insulation film spacer; and
    forming a first metal silicide film in the air spacer; and
    forming a second metal silicide film over the contact plug.

11. The method according to claim 10, wherein forming the contact plug includes:
   forming a conductive layer over the structure including the conductive pattern; and
   forming a photoresist pattern over the conductive layer; and
   etching the conductive layer using the photoresist pattern as a mask.

12. The method according to claim 11, wherein the conductive layer includes a silicon material.

13. The method according to claim 11, wherein the conductive layer includes a polysilicon material.

14. The method according to claim 10, wherein forming the sacrificial insulation film spacer includes:
   forming a sacrificial insulation film over the contact plug; and
   etching back the sacrificial insulation film.

15. The method according to claim 14, wherein the sacrificial insulation film includes an oxide film or a nitride film.

16. The method according to claim 10, wherein forming the air spacer includes performing a dip-out process removing the sacrificial insulation film spacer.

17. The method according to claim 10, wherein forming the first metal silicide film and the second metal silicide film include:
   forming a metal layer over the contact plug and the interlayer insulation film to fill the air spacer; and
   performing a silicification process on the metal layer.

18. The method according to claim 17, wherein the metal layer includes titanium (Ti), nickel (Ni), tantalum (Ta), tungsten (W) or cobalt (Co).

19. The method according to claim 10, wherein the second metal silicide film is diffused into the contact plug.

* * * * *